(12) United States Patent
Kimura et al.

(10) Patent No.: US 6,686,647 B2
(45) Date of Patent: Feb. 3, 2004

(54) GUNN DIODE AND METHOD OF MANUFACTURING THE SAME

(75) Inventors: Chikao Kimura, Kamifukuoka (JP); Atsushi Nakagawa, Kamifukuoka (JP)

(73) Assignee: New Japan Radio Co., Ltd.,, Tokyo (JP)

( * ) Notice: Subject to any disclaimer, the term of this patent is extended or adjusted under 35 U.S.C. 154(b) by 0 days.

(21) Appl. No.: 09/878,387

(22) Filed: Jun. 12, 2001

(65) Prior Publication Data

US 2002/0185709 A1 Dec. 12, 2002

(51) Int. Cl.[7] ............................................. H01L 31/107
(52) U.S. Cl. ..................... 257/604; 257/6; 257/197; 257/603; 438/91; 438/403; 438/412
(58) Field of Search ........................... 257/6, 197, 603, 257/604; 438/91, 403, 412

(56) References Cited

U.S. PATENT DOCUMENTS 5,734,193 A * 3/1998 Bayraktaroglu et al. ..... 257/579
5,912,500 A * 6/1999 Costello et al. .............. 257/434

FOREIGN PATENT DOCUMENTS

| JP | 2000091846 | * | 3/2000 | ............ H03B/9/14 |
| JP | 2001185780 | * | 7/2001 | ............ H01L/47/02 |
| JP | 2001185781 | * | 7/2001 | ............ H01L/47/02 |

* cited by examiner

*Primary Examiner*—David Nelms
*Assistant Examiner*—Dao H. Nguyen
(74) *Attorney, Agent, or Firm*—Armstrong, Kratz, Quintos, Hanson & Brooks, LLP.

(57) ABSTRACT

Indium phosphor (InP) Gunn diode that realizes improvements in thermal characteristics, yield factor of good products and easy assembly to planar circuits is provided.

In a Gunn diode of the present invention, contact layers are interposing an active layer. An anode electrode and a cathode electrode are formed on the uppermost contact layer. A high resistance region around the cathode electrode is formed at least in an uppermost contact layer by ion implantation using the cathode and anode electrode as a mask.

A region under the cathode electrode functions as a Gunn diode and a region under the anode electrode function as a conductive path from the anode electrode to the active layer. These two regions are defined by the high resistance region.

13 Claims, 7 Drawing Sheets

GUNN DIODE AND METHOD OF MANUFACTURING THE SAME

BACKGROUND OF THE INVENTION

The present invention relates to Gunn diodes used for oscillation of microwaves and millimeter waves, and is especially related to Gunn diodes which realize improvements in thermal characteristics, yield factor of good products and easy assembly to planar circuits, and manufacturing methods thereof.

Gunn diodes for oscillation of microwaves or millimeter waves are usually comprised of compound semiconductors such as gallium arsenide (GaAs) or indium phosphide (InP). It is the case with such compound semiconductors that the electron mobility is several thousands of $cm^2/V \cdot sec$ and thus large in a low electric field while the mobility is decreased in case a large electric field is applied since accelerated electrodes transit to a band of large effective mass and thus causes generation of negative differential mobility within the bulk. Consequently, a negative differential conductance is caused in the current-voltage characteristics and leads to thermodynamic instability. Therefore, a domain is generated which transits from the cathode side to the anode side. Repetition of this phenomenon results in vibrating current (oscillation).

An oscillating frequency ft can be determined from transit distance L of the domain and average drift velocity Vd of the electrons with an equation ft=Vd/L in a microwave range. Energy relaxation time consists of time needed for the electron to increase and decrease energy at Γ valley is a main cause for fixing the upper limit of oscillating frequency in a millimeter wave range. It is reported that the relaxation time constant of GaAs is twice as a mode of fundamental frequency of InP and a cut-off frequency of GaAs and InP is 100 GHz and 200 GHz respectively (M. A. di Forte-poisson et al.: Proc. IPRM'89, p.551 (1989)). Since the upper limit of the oscillating frequency of GaAs Gunn diode ranges 60 GHz through 70 GHz in the practical application, higher frequency bands such as 77 GHz band that is used for car mount radar is appropriate to InP Gunn diode.

In case of Gunn diodes for millimeter waves, this distance of transit needs to be extremely short (1 to 2 μm). In addition, the product of an impurity concentration and a distance of transit for the domain (active layer) needs to be set to be a specified value (e.g. $1 \times 10^{12}/cm^2$) to obtain sufficient oscillating efficiency, while the impurity concentration of the active layer becomes rather high in high frequency zones like those of millimeter waves since the oscillating frequency is unambiguously determined by the thickness of the active layer. The current concentration during operation is determined by the product of the impurity concentration of the active layer and a saturation electron speed, and in zones of the millimeter waves, the temperature of the active layer is increased owing to the increase in current concentration, whereby the oscillating efficiency is decreased.

In order to solve such problems, measures had been taken with conventional Gunn diodes for millimeter waves such as employing a mesa-type structure to use elements including the active layer of extremely small sizes, having diameters of approximately several tens of μm, and assembling the diodes within pill-type packages comprised with a heat portion made of diamond or similar material of favorable thermal conductivity.

A sectional view of InP Gunn diode element 100 of conventional mesa-type structure is shown in FIG. 8. On to a semiconductor substrate 101 of heavily doped n-type InP, there are sequentially laminated, through MOCVD method, a first contact layer 102 of heavily doped n-type InP, an active layer 103 of lightly doped n-type InP, and a second contact layer 104 of heavily doped n-type InP, and it is employed a mesa-type structure in order to reduce the transit space for the electrons.

Thereafter, a lower surface of the semiconductor substrate 101 is laminated, a cathode electrode 105 is formed onto the surface of the semiconductor substrate 101 while an anode electrode 106 is formed on the surface of the second contact layer 104, and by performing element separation, the Gunn diode element is completed.

The Gunn diode element 100 thus obtained is built-in in a pill-type package 110 as shown in FIG. 9. This pill-type package 110 comprises a heat sink electrode 111 and a cylinder 112 of glass or ceramics that serves as an enclosure for enclosing the Gunn diode element 100, wherein the cylinder 112 is brazed by hard-soldering to the heat sink electrode 111. The Gunn diode element 100 is electrostatically attracted by a bonding tool of TiC or the like (not shown) and is adhered to the heat sink electrode 111.

Further, the Gunn diode element 100 and a metal layer provided at a tip of the cylinder 112 are connected by a gold ribbon 113 through thermo-compression bonding or the like. After connecting the gold ribbon 113, a lid-like metallic disk 114 is brazed onto the cylinder 112 to complete the building-in to the pill-type package 110.

Conventional InP Gunn diode elements 100 are formed through chemical wet etching by employing a photoresist as an etching mask to obtain the above described mesa-type structure. However, since etching is progressed not only in the depth direction but also simultaneously in lateral directions in this etching method, it is presented a drawback during manufacture that control of the transit space of the electrons (active layer) is made very difficult, whereby ununiformity in electrical characteristics of Gunn diode element is caused.

Also there is a disadvantage that an alloy electrode such as AuGe, which is used for the anode electrode 106, reacts with In at relatively low temperature, thereby causing deterioration of anode electrode obtaining ohmic contact.

There is another disadvantage that Gunn diode may be burned out since current is concentrated to surface of mesa structure due to the instability of the surface of mesa structure in the active layer 103 of InP.

There is still another disadvantage that the bonding tool intercepted one's field of view, at the time of building-in the Gunn diode element in a pill-type package 110, during adhesion of the Gunn diode element 100 to the heat sink electrode 111 so that the heat sink electrode 111 could not be directly viewed at. Consequently, the efficiency of building-in operation was quite poor.

Further, utilization of a gold ribbon for assembling the pill-type package 110 incorporated with the Gunn diode element 100 to the microstrip line arranged on the plate substrate resulted in generation of parasitic inductance, whereby ununiformity in electrical characteristics was caused during the assembly.

It is an object of the present invention to provide Gunn diodes and manufacturing methods thereof which solve the above described problems.

SUMMARY OF THE INVENTION

For this purpose, according to the first aspect of the present invention, a Gunn diode, in which a first semiconductor layer of heavily doped n-type InP, an active layer of lightly doped n-type InP and a second semiconductor layer of heavily doped n-type InGaAs are formed on a semiconductor substrate of heavily doped n-type InP in said order, further comprising a first electrode of smaller area and a second electrode of larger area both formed on the second semiconductor layer to apply voltages to the active layer, and a high resistance region formed at least deeply to the lower surface of the second semiconductor layer by ion implantation and separating a region covered with the first electrode from the other in the second semiconductor layer, so as to let regions under the first electrode in the second semiconductor layer and the active layer work as a Gunn diode is provided.

According to the second aspect of the present invention, a Gunn diode, in which a first semiconductor layer of heavily doped n-type InP, an active layer of lightly doped n-type InP, a second semiconductor layer of heavily doped n-type InP and a third semiconductor layer of heavily doped InGaAs are formed on a semiconductor substrate of heavily doped n-type InP in said order, further comprising a first electrode of smaller area and a second electrode of larger area both formed on the third semiconductor layer to apply voltages to the active layer, and a high resistance region formed at least deeply to the lower surface of the second semiconductor layer by ion implantation and separating regions covered with the first electrode from the others in the third and second semiconductor layer, so as to let regions under the first electrode in the second semiconductor layer and the active layer work as a Gunn diode is provided.

According to the third aspect of the present invention, a Gunn diode, in which a first semiconductor layer of heavily doped n-type InGaAs, an active layer of lightly doped n-type InP, a second semiconductor layer of heavily doped n-type InP and a third semiconductor layer of heavily doped InGaAs are formed on a semiconductor substrate of heavily doped n-type InP in said order, further comprising a first electrode of smaller area and a second electrode of larger area both formed on the third semiconductor layer to apply voltages to the active layer, and a high resistance region formed at least deeply to the lower surface of the second semiconductor layer by ion implantation and separating regions covered with the first electrode from the others in the third and second semiconductor layer, so as to let regions under the first electrode in the first semiconductor layer and the active layer work as a Gunn diode is provided.

According to the fourth aspect of the present invention, a Gunn diode, in which a first semiconductor layer of heavily doped n-type InGaAs, an active layer of lightly doped n-type InP and a second semiconductor layer of heavily doped n-type InP are formed on a semiconductor substrate of heavily doped n-type InP in said order, further comprising a first electrode of smaller area and a second electrode of larger area both formed on the second semiconductor layer to apply voltages to the active layer, and a high resistance region formed at least deeply to the lower surface of the second semiconductor layer by ion implantation and separating a region covered with the first electrode from the other in the second semiconductor layer, so as to let regions under the first electrode in the first semiconductor layer and the active layer work as a Gunn diode is provided.

The Gunn diode according to the fifth aspect of the present invention, a Gunn diode, in which a first semiconductor layer of heavily doped n-type GaAs, an active layer of lightly doped n-type GaAs and a second semiconductor layer of heavily doped n-type GaAs are formed on a semiconductor substrate of heavily doped n-type GaAs in said order, further comprising a first electrode of smaller area and a second electrode of larger area both formed on the second semiconductor layer to apply voltages to the active layer, and a high resistance region formed at least deeply to the lower surface of the second semiconductor layer by ion implantation and separating a region covered with the first electrode from the other in the second semiconductor layer, so as to let regions under the first electrode in the second semiconductor layer and the active layer work as a Gunn diode is provided.

According to the sixth aspect of the present invention, a Gunn diode, in which a first semiconductor layer of heavily doped n-type InP, an active layer of lightly doped n-type InP and a second semiconductor layer of heavily doped n-type InP are formed on a semiconductor substrate of heavily doped n-type InP in said order, further comprising a first electrode of smaller area and a second electrode of larger area both formed on the second semiconductor layer to apply voltages to the active layer, and a high resistance region formed at least deeply to the lower surface of the second semiconductor layer by ion implantation and separating a region covered with the first electrode from the other in the second semiconductor layer, so as to let regions under the first electrode in the second semiconductor layer and the active layer work as a Gunn diode is provided.

According to the seventh aspect of the present invention is so arranged that the first electrode and the second electrode are formed with refractory metal such as WSi, Mo or the like in said first to third aspects.

The Gunn diode according to the eighth aspect of the present invention is so arranged that the first semiconductor layer is composed of $In_{0.53}Ga_{0.47}As$ for lattice matching with the semiconductor substrate of InP in said third and fourth aspects.

The Gunn diode according to the ninth aspect of the present invention is so arranged that the first electrode and the second electrode are composed of a base electrode and one or more conductive bumps on the base electrode respectively, and the conductive bumps have their tops at a substantially same level in said first to sixth aspects.

The Gunn diode according to the tenth aspect of the present invention is so arranged that the conductive bump of the first electrode is formed in the central part of the Gunn diode and the conductive bumps of the second electrode are formed therebetween in said ninth aspect.

The Gunn diode according to the eleventh aspect of the present invention is so arranged that the area of the second electrode is larger than that of the first electrode by 10 to 1000 times in said first to tenth aspects.

The Gunn diode according to the twelfth aspect of the present invention is so arranged that two or more electrode are formed as the first electrode along with respective high resistance regions in said first to eleventh aspects.

The Gunn diode of the thirteenth aspect of the present invention further comprises a third electrode formed on the lower surface of the semiconductor substrate, wherein the first electrode and the third electrode are used for applying voltages to the active layer and the second electrode is used as a mounting spacer to fix the Gunn diode in said first to twelfth aspects.

A method for manufacturing a Gunn diode of the fourteenth aspect of the present invention comprises step of preparing a semiconductor substrate of heavily doped n-type InP having a first semiconductor layer of heavily doped n-type InP, an active layer of lightly doped n-type InP and a second semiconductor layer of heavily doped n-type InGaAs formed thereon in said order, step of forming a first electrode of smaller area and a second electrode of larger area on the second semiconductor layer, and step of forming a high resistance region, by ion implantation using the first electrode and the second electrode as a mask, at least deeply to reach the lower surface of the second semiconductor layer.

A method for manufacturing a Gunn diode of the fifteenth aspect of the present invention comprises step of preparing a semiconductor substrate of heavily doped n-type InP having a first semiconductor layer of heavily doped n-type InP, an active layer of lightly doped n-type InP, a second semiconductor layer of heavily doped n-type InP and a third semiconductor layer of heavily doped n-type InGaAs formed thereon in said order, step of forming a first electrode of smaller area and a second electrode of larger area on the third semiconductor layer, and step of forming a high resistance region, by ion implantation using the first electrode and the second electrode as a mask, at least deeply to reach the lower surface of the second semiconductor layer.

A method for manufacturing a Gunn diode of the sixteenth aspect of the present invention comprises step of preparing a semiconductor substrate of heavily doped n-type InP having a first semiconductor layer of heavily doped n-type InGaAs, an active layer of lightly doped n-type InP, a second semiconductor layer of heavily doped n-type InP and a third semiconductor layer of heavily doped n-type InGaAs formed thereon in said order, step of forming a first electrode of smaller area and a second electrode of larger area on the third semiconductor layer, and step of forming a high resistance region, by ion implantation using the first electrode and the second electrode as a mask, at least deeply to reach the lower surface of the second semiconductor layer.

A method for manufacturing a Gunn diode of the seventeenth aspect of the present invention comprises step of preparing a semiconductor substrate of heavily doped n-type InP having a first semiconductor layer of heavily doped n-type InGaAs, an active layer of lightly doped n-type InP and a second semiconductor layer of heavily doped n-type InP formed thereon in said order, step of forming a first electrode of smaller area and a second electrode of larger area on the second semiconductor layer, and step of forming a high resistance region, by ion implantation using the first electrode and the second electrode as a mask, at least deeply to reach the lower surface of the second semiconductor layer.

A method for manufacturing a Gunn diode of the eighteenth aspect of the present invention comprises step of preparing a semiconductor substrate of heavily doped n-type GaAs having a first semiconductor layer of heavily doped n-type GaAs, an active layer of lightly doped n-type GaAs and a second semiconductor layer of heavily doped n-type GaAs formed thereon in said order, step of forming a first electrode of smaller area and a second electrode of larger area on the second semiconductor layer, and step of forming a high resistance region, by ion implantation using the first electrode and the second electrode as a mask, at least deeply to reach the lower surface of the second semiconductor layer.

A method for manufacturing a Gunn diode of the nineteenth aspect of the present invention comprises step of preparing a semiconductor substrate of heavily doped n-type InP having a first semiconductor layer of heavily doped n-type InP, an active layer of lightly doped n-type InP and a second semiconductor layer of heavily doped n-type InP formed thereon in said order, step of forming a first electrode of smaller area and a second electrode of larger area on the second semiconductor layer, and step forming a high resistance region, by ion implantation using the first electrode and the second electrode as a mask, at least deeply to reach the lower surface of the second semiconductor layer.

In a method for manufacturing a Gunn diode of the twentieth aspect of the present invention, the step of forming the first and the second electrode comprises step of forming base electrodes of the first electrode and the second electrode respectively and step of forming conductive bumps, having their tops at a substantially same level, on the base electrodes in said fourteenth to nineteenth aspects.

BRIEF EXPLANATION OF THE DRAWINGS

FIG. 1 illustrates a Gunn diode of the first embodiment of the present invention.

DETAILED DESCRIPTION

Embodiment 1

Figure 1A:
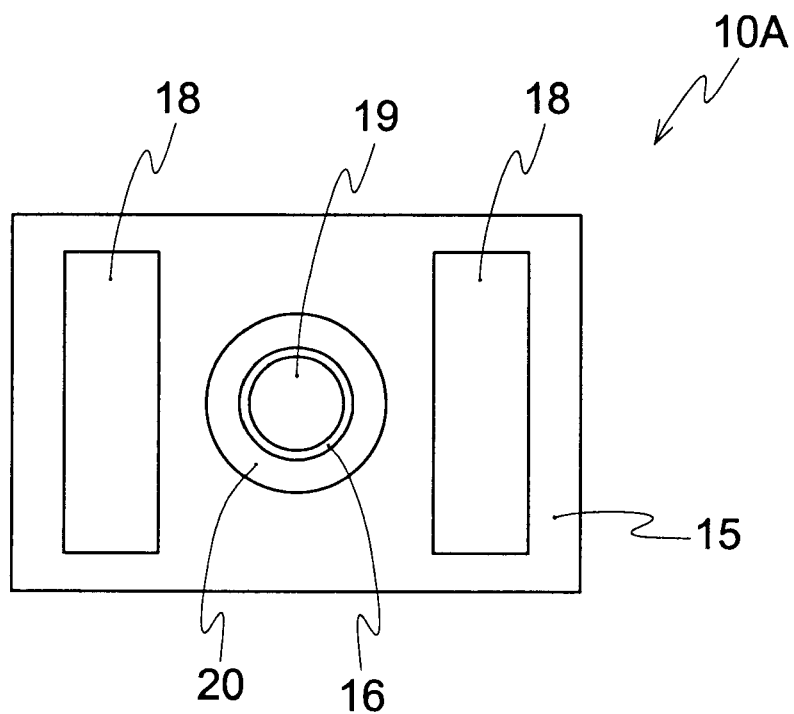
FIG. 1(a) is a top view and FIG. 1(b) is a sectional view.
Figure 1B:
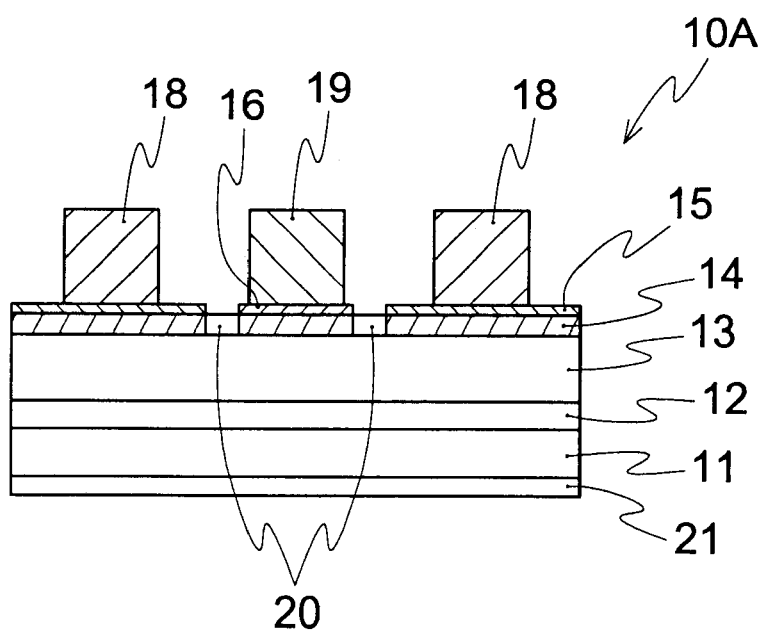

FIGS. 1(a) and 1(b) are diagrams showing a structure of a InP Gunn diode 10A according to a first embodiment of the present invention, wherein FIG. 1(a) is a top view and FIG. 1(b) is a sectional view. FIG. 2 is a view showing manufacturing steps.

Onto a semiconductor substrate 11 of heavily doped n-type InP having an impurity concentration of $1 \times 10^{18}$ to $2 \times 10^{18}$ atom/cm$^3$, there are sequentially laminated through MOCVD method a first contact layer 12 of heavily doped n-type InP having an impurity concentration of $2 \times 10^{18}$ atom/cm$^3$ and a thickness of 0.5 μm, an active layer 13 of lightly doped n-type InP having an impurity concentration of $1.2 \times 10^{16}$ atom/cm$^3$ and a thickness of 1.6 μm, and a second contact layer 14 of heavily doped n-type $In_{0.53}Ga_{0.47}As$ having an impurity concentration of $1 \times 10^{19}$ atom/cm$^3$ and a thickness of 0.2 μm.

Secondly, refractory metal such as WSi is deposited on the overall surface of the second contact layer 14. Then, on to the WSi layer, a mask (not shown) is formed with a metallic film of Ti/Pt/Au. With using the mask, anode electrode 15 and cathode electrode 16 are formed with etching the WSi layer through gas such as $SF_6$ (refer to FIG. 2(a)). As shown in FIG. 1, the cathode electrode 16 is surrounded with the anode electrode 15. The planar shape of the anode electrode 15 is oblong and the planar shape of the cathode electrode 16 is round, while these might alternatively be oval or substantially square.

The reason for employing WSi for the electrodes 15 and 16 is that WSi is a refractory metal with thermal stability, and also can obtain ohmic contact with the second contact layer 14 consists of InGaAs without alloying. Other than the WSi, Mo or the like may be used as a refractory metal.

In a case where no refractory metal such as WSi, Mo or the like is used, onto the second contact layer 14, there is a patterned a photoresist that is opened at regions on which a cathode electrode and an anode electrode are to be formed, and a metal film (underlying electrode layer) of AuGe, Ni, Au or the like that is in ohmic contact with the second layer 14 is vapor-deposited thereon. After removing the photoresist, a heat treatment (sintering) is performed, and anode electrode 15 and cathode electrode 16 are formed on the second contact layer 14 in a separate manner.

Figure 2A:
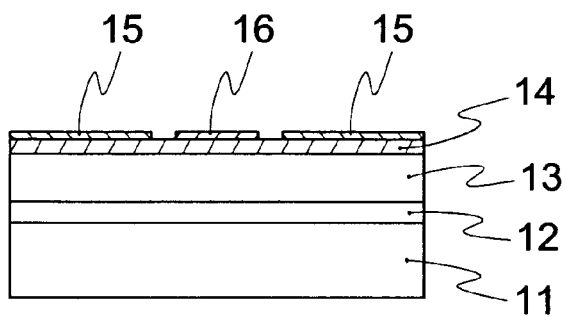
FIG. 2 is a sectional view showing manufacturing method of the Gunn diode in FIG. 1.
Figure 2B:
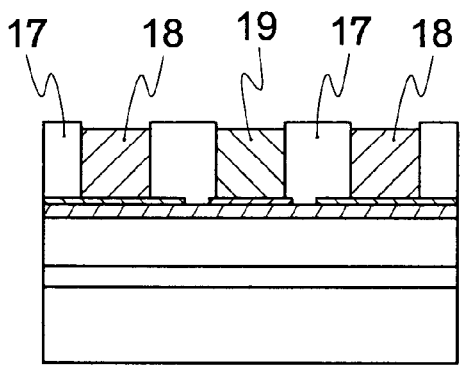
Figure 2C:
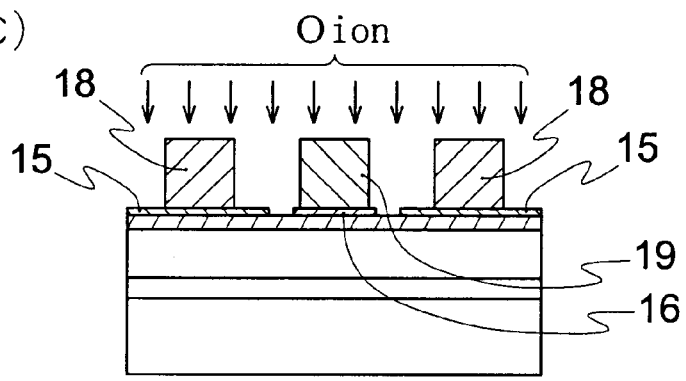
Figure 2D:
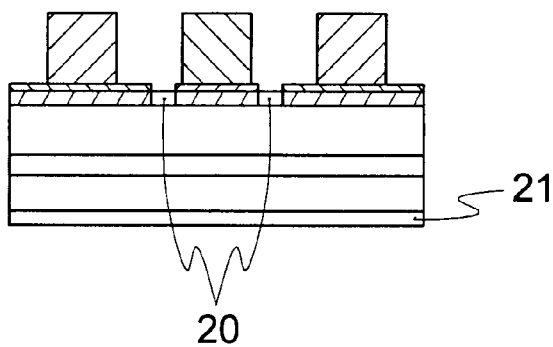

Photoresist 17 is patterned as to leave a part of the surfaces of the anode electrode 15 and cathode electrode 16 open, and bumps (electrodes) 18, 19 which are conductive protrusions of Au or the like are formed in the open portions through precipitation by electrolytic plating or non-electrolytic plating (Refer to FIG. 2(b)).

Next, after exposing the second contact layer through removing the photoresist 17, the anode electrode 15 and cathode electrode 16 are used as a mask and oxygen (O) ion is injected. The ion implantation is carried out three times in total providing acceleration energy is 40 KeV, 200 KeV and 300 KeV and each amount of dose is $1\times10^{14}/cm^2$, $2\times10^{14}/cm^2$ and $3\times10^{14}/cm^2$ to form almost uniform high resistance region 20 through heat treatment at 300 degrees. In this manner, high resistance region 20 can be accurately formed through ion implantation due to self-alignment using the anode electrode 15 and the cathode electrode 16 as a mask.

Further, while the resistance of the high resistance region 20 can be equal or higher than the active layer 13, 0.1 Ω·cm or higher is preferable. In addition, the high resistance region 20 can be formed deeper to reach into the active layer 13, or further into the first contact layer 12.

In a Gunn diode 10A according to the present embodiment, it is possible to avoid the occurrence of burn-out due to the current concentration result from instability of the exposed surface, because the surface of the active layer 13 is covered with the second contact layer 14 and the high resistance region 20, and not exposed.

Further, boron (B), iron (Fe), hydrogen (H) or the like can be used for ion implantation other than oxygen (O).

The area of the active layer 13 to which the cathode electrode 16 which has been sub-divided by the high resistance region 20 is connected is set to be an area (transverse cross section) with which a specified operating current of the Gunn diode can be obtained. That is, this area is set to be an area that can function as a Gunn diode. Further, an area of the active layer 13 to which the anode electrode 15 is connected is set to be larger enough than an area of the active layer 13 to which the cathode electrode 16 is connected, and the electric resistance of a semiconductor laminated portion below the anode electrode 15 is made to be smaller than the electric resistance of a semiconductor laminated portion below the cathode electrode 16. With these arrangements, the portion below the anode electrode 15 is not made to function as a Gunn diode but to function as a resistance of substantially low value, and the anode electrode 15 is substantially connected to the first contact layer 12.

The ratio of area to which the anode electrode 15 is connected to the area to which the cathode electrode 16 is connected in the active layer 13 needs to be not less than 10, and preferably 10 to 1000, since a ratio of below 10 would not be effective but only results in a decreased conversion efficiency.

Next, the lower surface of the semiconductor substrate 11 is polished to thin the semiconductor substrate 11 in accordance with the ordinary manufacturing processes for Gunn diodes such that the thickness of the whole Gunn diode becomes approximately 100 μm. Thereafter, if required, a metal film 21 of AuGe, Ni, Au, Ti, Pt or Au that is in ohmic contact with the semiconductor substrate 11 is vapor-deposited onto the lower surface of the semiconductor substrate 11, and a heat treatment is performed (FIG. 2(d)), the metal film 21 that is formed on the lower surface of the semiconductor substrate 11 is not necessarily required. However, if the metal film 21 is formed, it might function as an anode electrode substituting the anode electrode 15 or along with the anode electrode 15 so that electrical resistance of the laminated semiconductor layers for the anode electrode can be decreased. Moreover, when the metal film 21 substitutes the anode electrode 15, the anode electrode 15 can be functioned as a spacer at the mounting since the anode electrode 15 and the cathode electrode 16 are mounted on the same surface.

As explained so far, the InP Gunn diode 10A according to the present embodiment is so arranged that the laminated semiconductor layers is divided, by the high resistance region 20 surrounding the cathode electrode 16, into a portion which functions as a Gunn diode (i.e. a portion under the cathode electrode 16 in the second contact layer 14 and the active layer 13) and the other portion which functions as a low resistance region for applying voltage to the first contact layer 12 under said portion of the Gunn diode function. With this arrangement, both the anode electrode 15 and cathode electrode 16 can be formed on the upper surface of the second contact layer 14. In other words, the anode electrode 15 and the cathode electrode 16 can be arranged on a same surface, whereby great advantages can be obtained in terms of easiness in implementation onto planer surfaces and superior heat dissipation.

Since ion implantation to define a region for determining an operational current (i.e. said portion of Gunn diode function) is performed through a self-alignment method by utilizing electrodes 15 and 16 formed above the region as a mask, thereby improving yield factor of good products.

Moreover, the electron is to be doped as hot electron from the cathode electrode 16 to the active layer 13 via the junction of InGaAs and InP (i.e. the junction of the second contact layer 14 and the active layer 13) having conduction band offset of 0.2 eV, thereby reducing required time for forming domain and increasing the oscillation efficiency.

Since the second contact layer 14 is composed by InGaAs, ohmic contact can be obtained with the electrodes (the anode electrode 15 and the cathode electrode 16) formed thereon without composing alloys therebetween. Accordingly, stable refractory metal such as WSi, Mo or the like can be employed for the electrodes. If the electrode is formed on a layer of InP, it is necessary to form the alloy of them to obtain ohmic contact so that AuGe, Au or the like is typically used for the electrode. In this case, however, Au in the electrode easily reacts with in the underneath layer so as to degrade the ohmic contact even at a relatively low temperature. In the embodiment in which the second contact layer of InGaAs and the electrodes of refractory metal are employed, such trouble does not arise.

Though the embodiment in which only one combination of the cathode electrode 16, the bump 19 and the high resistance region 20 is formed in the central region of the diode is described above, two or more combinations may be formed between the bumps 18. The combinations of the cathode electrode 16, the bump 19 and the high resistance region 20 may be arranged in a matrix-like manner, staggered manner, radiated manner, concentric manner or the like. To form two or more combinations in one Gunn diode, the function of the mesa structure to accomplish the operation of the Gunn diode is distributed to the two or more regions. Therefore, the efficiency of heat radiation is greatly improved so that the oscillating efficiency and output power are also greatly increased.

Embodiment 2

Figure 3:
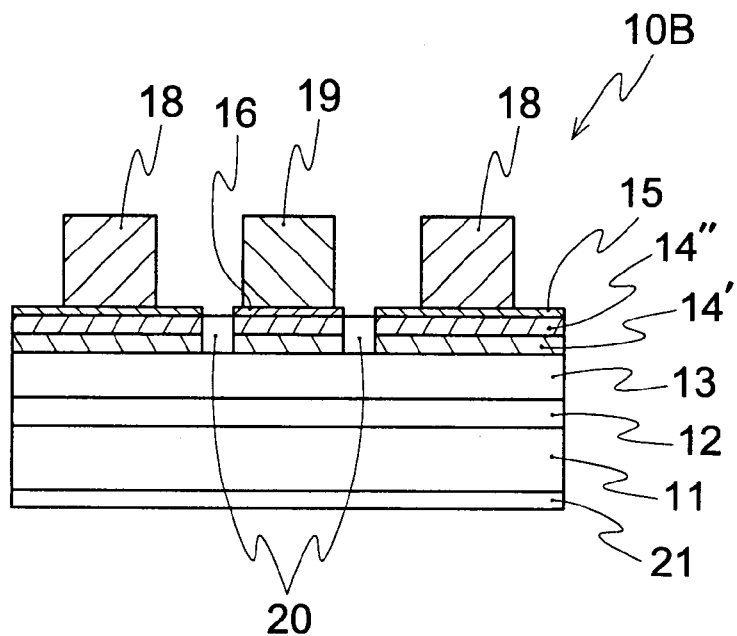
FIG. 3 is a sectional view of the Gunn diode of second embodiment.

FIG. 3 is a cross sectional view of Gunn diode 10B according to the second embodiment of the present invention. Onto a semiconductor substrate 11 heavily doped n-type Inp having an impurities concentration of $1 \times 10^{18}$ to $2 \times 10^{18}$ atom/cm$^3$, there are sequentially laminated through MOCVD method the first contact layer 12 of heavily doped n-type InP having an impurity concentration of $2 \times 10^{18}$ atom/cm$^3$ and a thickness of 0.5 μm, and the active layer 13 of lightly doped n-type InP having an impurity concentration of $1.2 \times 10^{16}$ atom/cm$^3$ and a thickness of 1.6 μm, and the second contact layer 14' of heavily doped n-type Inp having an impurity concentration of $2 \times 10^{18}$ atom/cm$^3$ and a thickness of 0.2 μm, and the third contact layer 14" of heavily doped n-type $In_{0.53}Ga_{0.47}As$ having an impurity concentration of $1 \times 10^{19}$ atom/cm$^3$ and a thickness of 0.2 μm.

Onto the third contact layer 14", the anode electrode 15 and the cathode electrode 16 of metallic films of WSi or the like that is in ohmic contact with the third contact layer 14" are formed separately. Further, similar to said first embodiment, the high resistance region 20 which surrounds the cathode electrode 16 and reaches to the lower surface of the second contact layer 14' is formed by performing ion implantation from the exposed surface of the third contact layer 14".

In a Gunn diode 10B according to the present embodiment, since the second contact layer 14' and the third contact layer 14" are laminated on the upper surface of the active layer 13 sequentially, it has the same arrangement as the first embodiment (described in relation to FIG. 1 and FIG. 2) except that the second contact layer 14' and the active layer 13 under the cathode electrode 16 function as Gunn diode and has the same advantages as the first embodiment.

The high resistance region 20 is needed for the second contact layer 14' and third contact layer 14" without fail, and it may be formed deeper to reach into the active layer 13, or further into the first contact layer 12.

Moreover, the functions of the anode electrode 15 and the cathode electrode 16 are interchangeable (i.e. the electrode 15 as cathode and the electrode 16 as anode).

Embodiment 3

Figure 4:
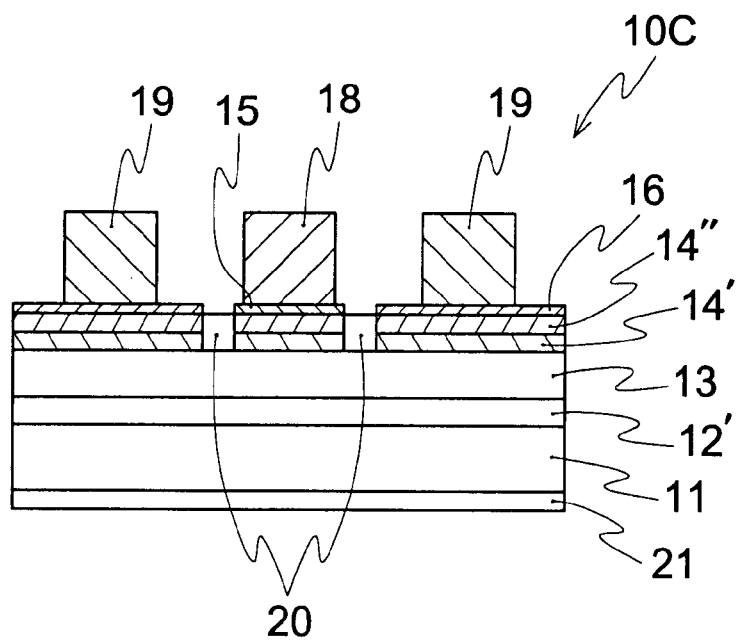
FIG. 4 is a sectional view of the Gunn diode of third embodiment.

FIG. 4 is a cross sectional view of the Gunn diode 10C according to the third embodiment of the present invention. In the embodiment, the first contact layer 12 of the second embodiment (shown in FIG. 3) is replaced by the first contact layer 12' of heavily doped n-type $In_{0.53}Ga_{0.47}As$ with the thickness of 0.2 μm.

Unlike to the first and second embodiment (shown in FIGS. 1 to 3), since the junction of the first contact layer 12' of heavily doped n-type InGaAs and the active layer 13 of lightly doped n-type InP which functions as Gunn diode is positioned at the lower surface of the active layer 13 (i.e. at the side of the first contact layer 12'), smaller electrode positioned central is to be the anode electrode 15 while larger electrode positioned outside is to be the cathode electrode 16.

The formation of the anode electrode 15, the cathode electrode 16 and bump 18, 19 are carried out by the same manner as described in relation to FIG. 2. And, the high resistance region 20 is formed by ion implantation from exposed surface of the third contact layer 14" to the lower surface of the second contact layer 14' in the same manner as described in FIGS. 2 and 3.

Further in the present embodiment, the first contact layer 12' is composed of $In_{0.53}Ga_{0.47}As$ for lattice matching with the semiconductor substrate 11 of InP, thereby not causing lattice defect in this epitaxial grown layer.

The Gunn diode 10C according to the present embodiment has similar arrangement as the first or second embodiment (shown in FIG. 1 to FIG. 3) except that the anode electrode 15 and the cathode electrode 16 are interchanged and has the same function and advantages as those of these embodiments.

Embodiment 4

Figure 5:
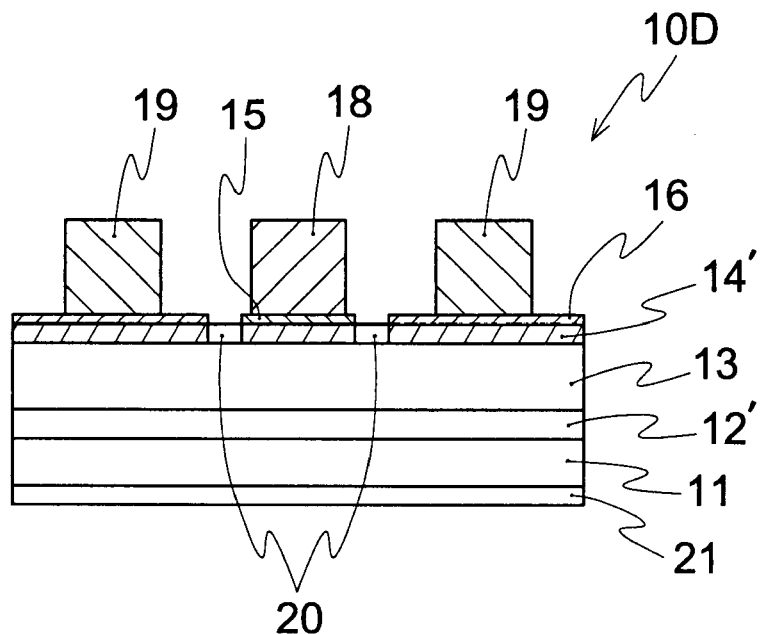
FIG. 5 is a sectional view of the Gunn diode of fourth embodiment.

FIG. 5 is a cross sectional view of a Gunn diode 10D according to the fourth embodiment of the present invention. In this embodiment, the third contact layer 14" in the third embodiment (refer to FIG. 4) is not formed and the second contact layer 14' of heavily doped n-type InP with an impurity concentration $2 \times 10^{18}$ atom/cm$^3$ is formed in a thickness of 0.3 μm on the active layer 13 of lightly doped n-type InP. Then onto there, the anode electrode 15 and the cathode electrode 16 are formed from a metal film consists of AuGe, Ni, Au or the like to obtain ohmic contact.

The high resistance region 20 is formed deeper to reach into the lower surface of the second contact layer 14' as same as the first embodiment (shown in FIGS. 1 and 2). However it also possible to form it deeper to reach into the active layer 13, or further into the first contact layer 12'.

In the embodiment, since the second contact layer 14' of heavily doped n-type InP is not covered with a semiconductor layer of heavily doped n-type InGaAs, the anode electrode 15 and the cathode electrode 16 to be formed on the second contact layer 14' required to be alloyed with the second contact layer 14' so as to obtain ohmic contact. Thus, there is a disadvantage that material such as Au, which is used for the anode electrode 15 and the cathode electrode 16, causes chemical reaction with In at relatively low temperature. However, in other aspects, it presents similar advantages as the first to third embodiments.

Embodiment 5

Figure 6:
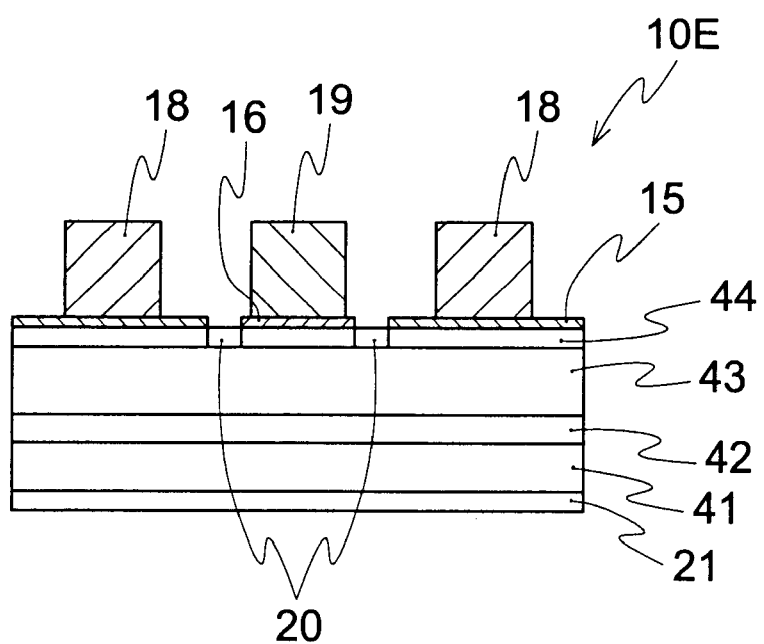
FIG. 6 is a sectional view of the Gunn diode of fifth embodiment.

FIG. 6 is a cross sectional view of the Gunn diode according to the fifth embodiment of the present invention. Onto a semiconductor substrate 41 of n-type GaAs having an impurity concentration of $1 \times 10^{18}$ to $2 \times 10^{18}$ atom/cm$^3$, there are sequentially laminated through MBE method a first contact layer 42 of n-type GaAs having an impurity concentration of $2 \times 10^{18}$ atom/cm$^3$ and a thickness of 1.5 μm, an active layer 43 of n-type GaAs having an impurity concentration of $1.2 \times 10^{16}$ atom/cm$^3$ and a thickness of 1.6 μm and a second contact layer 44 of n-type GaAs having an impurity concentration of $1 \times 10^{18}$ atom/cm$^3$ and the thickness of 0.3 μm.

The anode electrode 15 and the cathode electrode 16 of metallic film comprising AuGe, Ni, Au or the like that can obtain ohmic contact are formed on the upper surface of second contact layer 44 separately.

Hereinafter, the high resistance region 20, which surrounds the cathode electrode 16 and reaches to the lower surface of the second contact layer 44, is formed by ion implantation from exposed surface of the second contact layer 44 in the same manner as described in the first embodiment. Though gallium arsenide (GaAs) is used in this embodiment, it is possible to have same arrangements as those of the first to fourth embodiments and same advantages as of these embodiment could be obtained. It may possible to change said semiconductor substrate 41 to a heavily doped n-type InP substrate, the first contact layer 42 to a heavily doped n-type InP, the active layer 43 to lightly doped n-type InP and the second contact layer 44 to a heavily doped n-type InP respectively.

Embodiment 6

Figure 7:
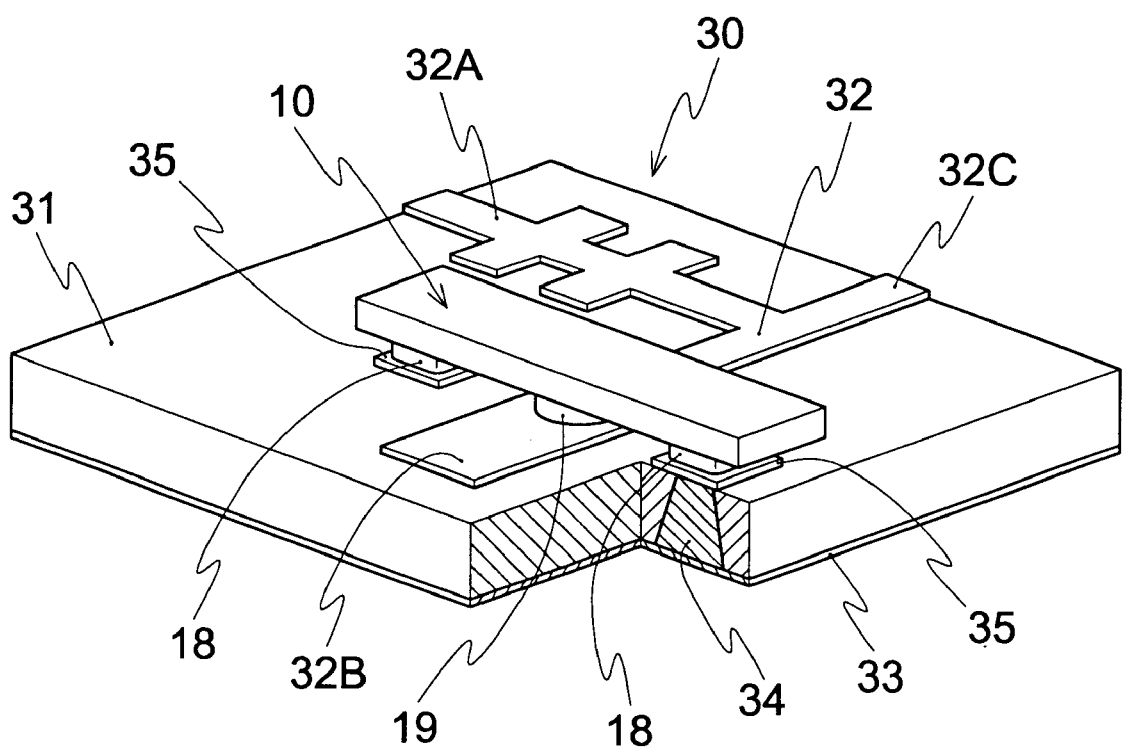
FIG. 7 is a perspective view showing a mounting structure of the Gunn diode according to sixth embodiment.
Figure 8:
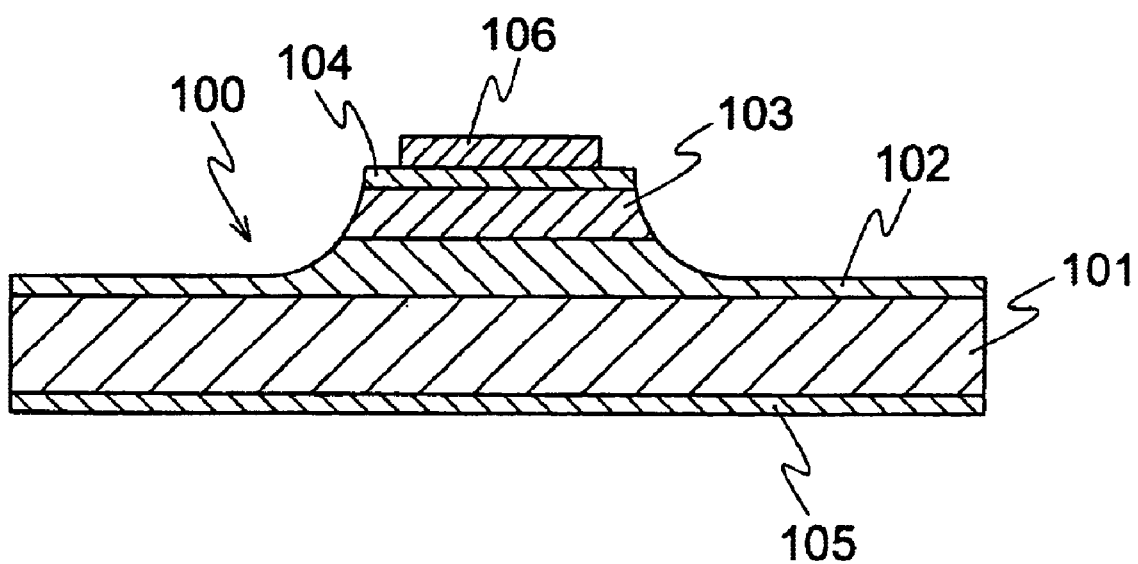
FIG. 8 is a sectional view of the conventional mesa structural Indium Phosphor (InP) Gunn diode.
Figure 9:
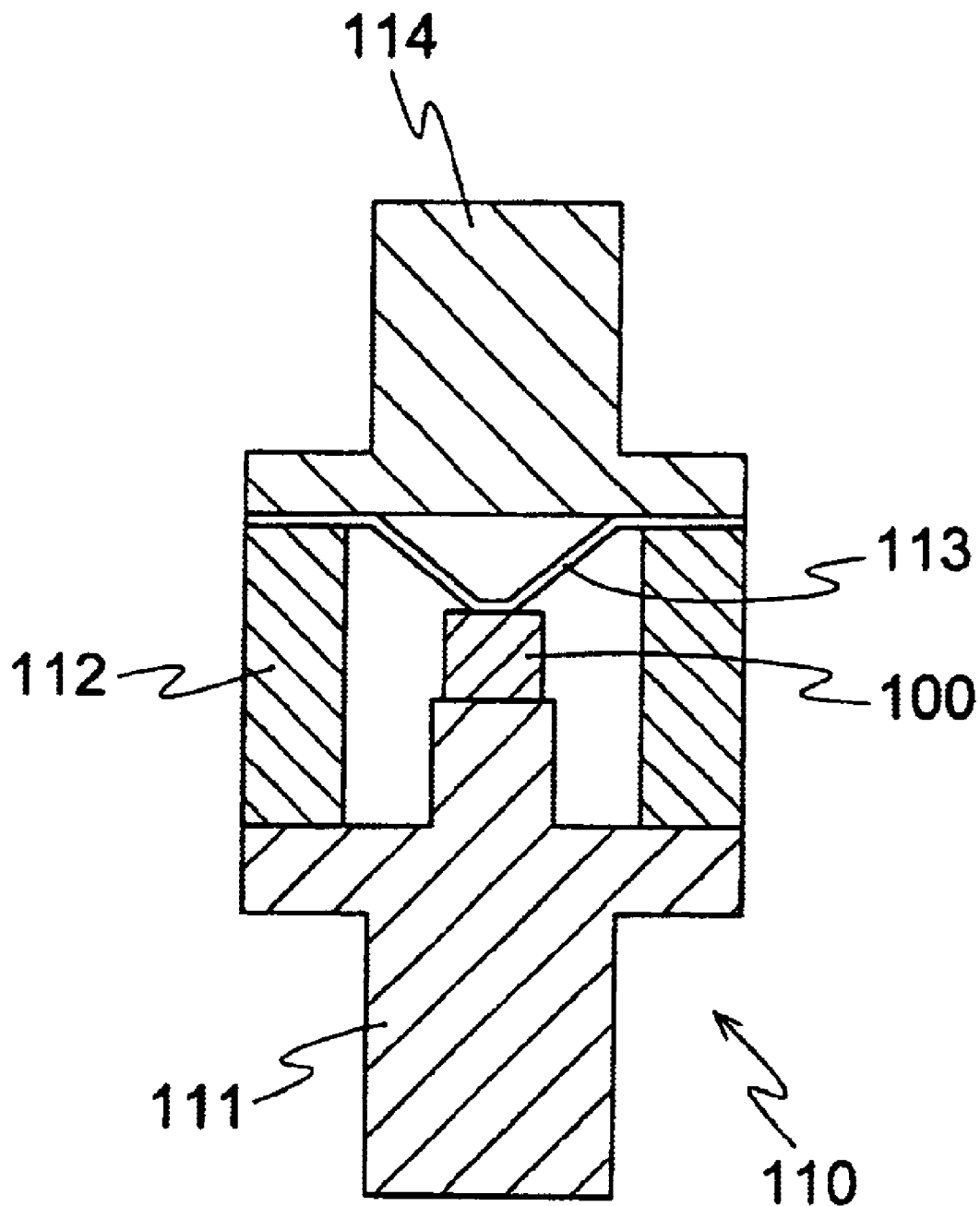
FIG. 9 is a sectional view of the Gunn diode mounted on pill type package.

FIG. 7 is a view showing one example of an arrangement in which a Gunn diode 10 (10A, 10B) is assembled on a planar circuit substrate forming a microstrip line 30 to form an oscillator. A signal electrode 32 is formed on a plate substrate 31 of semi-insulating material such as aluminum nitride (AlN), silicone (Si), silicone carbide (SiC) or diamond having a favorable resistivity of not less than 106 Ω·cm and a thermal conductivity of not less than 140 W/mK, and the lower surface thereof is formed a ground electrode 33. 34 denotes via holes filled with tungsten, that connect the ground electrode 33 on the lower surface and surface ground electrode 35 formed on the upper surface.

A bump 19 of an anode electrode of the Gunn diode 10 is connected to the signal electrode 32, and bumps 18 of cathode electrodes are connected to the surface ground electrode 35. 32A denotes an electrode of a bias portion for supplying power source voltage to the Gunn diode 10, 32B an electrode for making up an resonator formed by the microstrip line including the Gunn diode element 10 and 32C an electrode of a signal output portion formed by the microstrip line.

The oscillator constructed by mounting Gunn diode 10 in such manner can obtain 60 mW oscillating power 77 GHz frequency with the length of the electrode 32B of 400 μm.

In this structure for assembly, the Gunn diode 10 is set in a facing-down posture and the bumps 18, 19 are directly connected to the electrodes 35, 32 without employing a gold ribbon. With this arrangement, generation of parasitic inductance owing to connection through the gold ribbon can be eliminated, and an oscillator with no variations in characteristics can be realized.

Since heat generated in the Gunn diode 10 is dissipated, via the bumps 18, 19, to the substrate 31 which also functions as a heat sink, thereby improving heat dissipating effects. Further, since the bumps 18 of the cathode electrode are positioned on both sides of the bump 19 in such an assembly of the Gunn diode 10, it can be prevented that excessive mechanical load is applied to the anode electrode.

As explained so far, since defining a region that is to function as a Gunn diode is performed by self-aligning ion implantation utilizing electrodes formed above this region as a mask, variations in characteristics are restricted in the Gunn diode of the present invention.

Further, since the bumps of the cathode electrode and anode electrode can be formed on a same plane to assume identical height levels in the Gunn diode of the present invention, the Gunn diode can be assembled in a (facing-down) down posture. With this arrangement, the Gunn diodes do not need to be incorporated into conventional pill-type packages, whereby advantages in terms of manufacturing are presented to enable easy assembly to plate substrates.

Also, since it is not required to connect the Gunn diode to minute electrodes through means such as gold ribbons at the time of assembly, parasitic inductance do not occur and variations in circuit characteristics owing to variations in lengths of the gold ribbon or the like can be eliminated.

In a case where semiconductor substrate to form the cathode and the anode electrodes thereon is composed by InGaAs, refractory metal can be used as the electrodes. Therefore it is possible to avoid the disadvantage that In reacts with Au, thereby causing deterioration of anode electrode obtaining ohmic contact.

Further, the high resistance region is formed for defining a region of anode electrode and cathode electrode, thereby notches, cutouts, or the like for defining the regions is not necessary. Therefore, burned out of the diode by electric current concentration due to the instability of the exposed surface of the active layer is prevented.

Further, in a case where InGaAs layer is formed on the cathode side of the active layer, electrons are injected as hot electrons into the active layer of InP via a junction of InGaAs and Inp, thereby shortening required time for forming domain and improving oscillating efficiency.

Further, in the arrangement in which the function of mesa-type structure is divided into a plurality of regions, the heat dissipating efficiency is remarkably improved so that the conversion efficiency and the output power can be largely improved.

What is claimed is:

1. A Gunn diode, in which a first semiconductor layer of heavily doped n-type InP, an active layer of lightly doped n-type InP and a second semiconductor layer of heavily doped n-type InGaAs are formed on a semiconductor substrate of heavily doped n-type InP in said order, further comprising:
    a first electrode of smaller area and a second electrode of larger area both formed on the second semiconductor layer to apply voltages to the active layer,
    and a high resistance region formed at least deeply to the lower surface of the second semiconductor layer by ion implantation and separating a region covered with the first electrode from the other in the second semiconductor layer, so as to let regions under the first electrode in the second semiconductor layer and the active layer work as a Gunn diode.

2. A Gunn diode of claim 1 wherein the first electrode and the second electrode are formed with refractory metal such as WSi, Mo or the like.

3. A Gunn diode of claim 1 wherein the first electrode and the second electrode are composed of a base electrode and one or more conductive bumps on the base electrode respectively, and the conductive bumps have their tops at a substantially same level.

4. A Gunn diode of claim 3 wherein the conductive bump of the first electrode is formed in the central part of the Gunn diode and at least two conductive bumps of the second electrode are formed having the conductive bump of the first electrode therebetween.

5. A Gunn diode of claim 1 wherein the area of the second electrode is larger than that of the first electrode by 10 to 1000 times.

6. A Gunn diode of claim 1 wherein two or more electrode are formed as the first electrode along with respective high resistance regions.

7. A Gunn diode of claim 1 further comprising a third electrode formed on the lower surface of the semiconductor substrate, wherein the first electrode and the third electrode are used for applying voltages to the active layer and the second electrode is used as a mounting spacer to fix the Gunn diode.

8. A Gunn diode, in which a first semiconductor layer of heavily doped n-type InP, an active layer of lightly doped n-type InP, a second semiconductor layer of heavily doped n-type InP and a third semiconductor layer of heavily doped InGaAs are formed on a semiconductor substrate of heavily doped n-type InP in said order, further comprising:

a first electrode of smaller area and a second electrode of larger area both formed on the third semiconductor layer to apply voltages to the active layer, and a high resistance region formed at least deeply to the lower surface of the second semiconductor layer by ion implantation and separating regions covered with the first electrode from the others in the third and second semiconductor layer, so as to let regions under the first electrode in the second semiconductor layer and the active layer work as a Gunn diode.

9. A Gunn diode, in which a first semiconductor layer of heavily doped n-type InGaAs, an active layer of lightly doped n-type InP, a second semiconductor layer of heavily doped n-type InP and a third semiconductor layer of heavily doped InGaAs are formed on a semiconductor substrate of heavily doped n-type InP in said order, further comprising:

a first electrode of smaller area and a second electrode of larger area both formed on the third semiconductor layer to apply voltages to the active layer, and a high resistance region formed at least deeply to the lower surface of the second semiconductor layer by ion implantation and separating regions covered with the first electrode from the others in the third and second semiconductor layer, so as to let regions under the first electrode in the first semiconductor layer and the active layer work as a Gunn diode.

10. A Gunn diode of claim 3 wherein the first semiconductor layer is composed of $In_{0.53}Ga_{0.47}As$ for lattice matching with the semiconductor substrate of InP.

11. A Gunn diode, in which a first semiconductor layer of heavily doped n-type InGaAs, an active layer of lightly doped n-type InP and a second semiconductor layer of heavily doped n-type InP are formed on a semiconductor substrate of heavily doped n-type InP in said order, further comprising:

a first electrode of smaller area and a second electrode of larger area both formed on the second semiconductor layer to apply voltages to the active layer, and a high resistance region formed at least deeply to the lower surface of the second semiconductor layer by ion implantation and separating a region covered with the first electrode from the other in the second semiconductor layer, so as to let regions under the first electrode in the first semiconductor layer and the active layer work as a Gunn diode.

12. A Gunn diode, in which a first semiconductor layer of heavily doped n-type GaAs, an active layer of lightly doped n-type GaAs and a second semiconductor layer of heavily doped n-type GaAs are formed on a semiconductor substrate of heavily doped n-type GaAs in said order, further comprising:

a first electrode of smaller area and a second electrode of larger area both formed on the second semiconductor layer to apply voltages to the active layer, and a high resistance region formed at least deeply to the lower surface of the second semiconductor layer by ion implantation and separating a region covered with the first electrode from the other in the second semiconductor layer, so as to let regions under the first electrode in the second semiconductor layer and the active layer work as a Gunn diode.

13. A Gunn diode, in which a first semiconductor layer of heavily doped n-type InP, an active layer of lightly doped n-type InP and a second semiconductor layer of heavily doped n-type InP are formed on a semiconductor substrate of heavily doped n-type InP in said order, further comprising:

a first electrode of smaller area and a second electrode of larger area both formed on the second semiconductor layer to apply voltages to the active layer, and a high resistance region formed at least deeply to the lower surface of the second semiconductor layer by ion implantation and separating a region covered with the first electrode from the other in the second semiconductor layer, so as to let regions under the first electrode in the second semiconductor layer and the active layer work as a Gunn diode.

* * * * *